(12) United States Patent
Soo et al.

(10) Patent No.: US 6,221,560 B1
(45) Date of Patent: Apr. 24, 2001

(54) METHOD TO ENHANCE GLOBAL PLANARIZATION OF SILICON OXIDE SURFACE FOR IC DEVICE FABRICATION

(75) Inventors: Choi Pheng Soo, Joher (MY); Lap Chan, San Francisco, CA (US)

(73) Assignees: Chartered Semiconductor Manufacturing Ltd.; National University of Singapore, both of Singapore (SG)

( * ) Notice: Subject to any disclaimer, the term of this patent is extended or adjusted under 35 U.S.C. 154(b) by 0 days.

(21) Appl. No.: 09/373,244

(22) Filed: Aug. 12, 1999

(51) Int. Cl.[7] .................................................. G03C 5/00
(52) U.S. Cl. ...................... 430/311; 430/322; 430/329; 216/67; 438/697; 438/699; 148/DIG. 50
(58) Field of Search ..................... 430/313, 311, 430/330, 329, 322; 216/67, 79, 108; 438/697, 699; 148/DIG. 51

(56) References Cited

U.S. PATENT DOCUMENTS

| | | | |
|---|---|---|---|
| 4,665,007 | 5/1987 | Cservak et al. ...................... | 430/311 |
| 5,077,234 | 12/1991 | Scoopo et al. ........................ | 437/67 |
| 5,885,751 | * 3/1999 | Weidman .............................. | 430/315 |
| 6,013,418 | * 1/2000 | Ma et al. .............................. | 430/323 |
| 6,090,530 | * 7/2000 | Weidman et al. .................... | 430/315 |

* cited by examiner

Primary Examiner—Thorl Chea
(74) Attorney, Agent, or Firm—George O. Saile; Rosemary L.S. Pike

(57) ABSTRACT

A new method for planarizing silicon dioxide surfaces in semiconductor structures. Starting with a structure of an underlying layer (for instance a layer of metal lines) a layer of oxide is deposited and profiled by positive tone imaging. A layer of PPMS is deposited. Using the mask of the starting structure, the PPMS layer is exposed changing the PPMS to PPMSO in the exposed regions. The unexposed PPMS is removed, the PPMSO (unexposed regions of the PPMS) are planarized, this planarization can proceed to the point where no more PPMSO is present (the PPMSO "columns" are removed together with the intra-layer of patterned oxide). The surface thus created shows excellent planarity, this surface can be further planarized down to the top level of the underlying pattern, if it is desirable to do so.

24 Claims, 3 Drawing Sheets

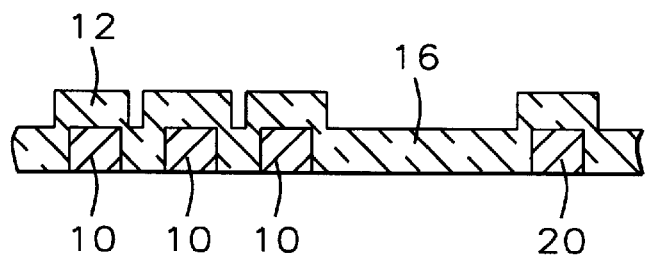
FIG. 1 - Prior Art
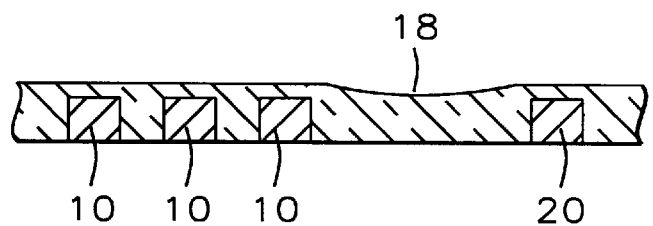
FIG. 2 - Prior Art
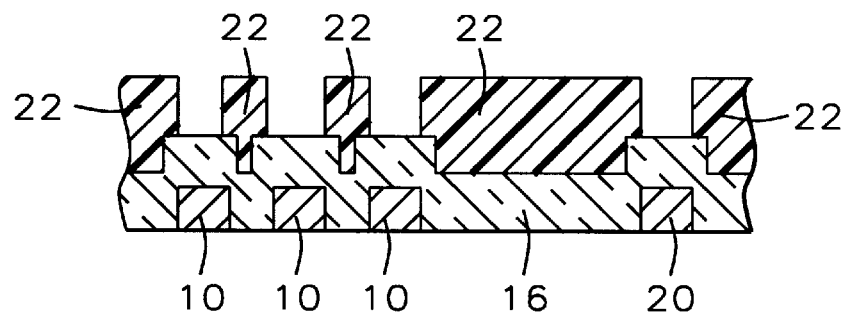
FIG. 3 - Prior Art
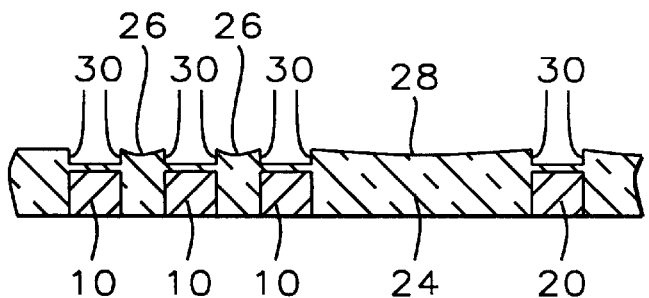
FIG. 4 - Prior Art

METHOD TO ENHANCE GLOBAL PLANARIZATION OF SILICON OXIDE SURFACE FOR IC DEVICE FABRICATION

BACKGROUND OF THE INVENTION (1) Field of the Invention

The invention relates to the field of integrated devices, and more specifically to a method of planarizing silicon dioxide surfaces in Integrated Circuit devices.

(2) Description of Prior Art

For planarization, a dry or wet etchback process can be used and has found wide application in the fabrication of semiconductor circuits. Chemical Mechanical Polishing (CMP) is an approach that has yielded very good planarization performance and that has been widely used. The factors that affect CMP can be classified in two groups. Chemistry related parameters include slurry type, pH value of slurry, the solid content of the slurry, slurry flow and process temperature. Mechanical related factors include polish pressure, back pressure, platen speed and pad type. With the CMP process, the step height of wafer topography can be reduced well in excess of 100 Angstrom.

For deep submicron planarization there are two major considerations. One is the filling of gaps with high aspect ratios. The other is to achieve actual global planarization.

The increasing need to form planar surfaces in semiconductor device fabrication has led to the development of a process technology known as Chemical Mechanical Planarization (CMP). In the CMP process, semiconductor substrates are rotated, face down, against a polishing pad in the presence of abrasive slurry. Most commonly, the layer to be planarized is an electrical insulating layer overlaying active circuit devices. As the substrate is rotated against the polishing pad, the abrasive force grinds away the surface of the insulating layer. Additionally, chemical compounds within the slurry undergo a chemical reaction with the components of the insulating layer to enhance the rate of removal. By carefully selecting the chemical components of the slurry, the polishing process can be made more selective to one type of material than to another. For example, in the presence of potassium hydroxide, silicon dioxide is removed at a faster rate than silicon nitride. The ability to control the selectivity of a CMP process has led to increased use in the fabrication of complex integrated circuits.

A common requirement of all CMP processes is that the substrate be uniformly polished. In the case of polishing an electrical insulating layer, it is desirable to polish the layer uniformly from edge to edge on the substrate. To ensure that a planar surface is obtained, the electrically insulating layer must be uniformly removed. Uniform polishing can be difficult because several machine parameters can interact to create non-uniformity in the polishing process. For example, in the case of CMP, misalignment of the polishing wheel with respect to the polishing platen can create regions of non-uniform polishing across the diameter of the polished surface. Other machine parameters, such as non-homogeneous slurry compositions and variations in the platen pressure, can also create non-uniform polishing conditions.

The purpose of applying CMP therefore is to achieve local and global planarization. The ability to achieve good planarity is of critical importance for the process of lithography while the process of planarization must be simple to use and flexible in where, within the sequence of semiconductor manufacturing processing steps, it can be applied. It is current practice to first chemically soften the surface that is to be planarized followed by mechanical planarization of the surface.

FIGS. 1 and 2 show cross sections of a typical semiconductor structure with metal lines 10 and 20 over which a layer 16, of for instance a dielectric, has been deposited. FIG. 1 shows the cross section before planarization. As a matter of distinction two different patterns of metal line deposition are shown, that is a dense pattern of three adjacent and in close physical proximity metal lines 10 and a isolated pattern where a single metal line 20 is deposited whereby no other metal lines are in its proximity. It is clear from the profile of the surface of deposition 12 that planarization aspects differ between the surface of layer 12 that is above the dense pattern of metal lines 10 and the surface of layer 12 that is above the single metal line 20. of special concern is the planarization of the area 16, in between these two different patterns of metal lines, since in this area 16 the deposition 12 exhibits a deep and wide curving inward of its surface, whereby the lowest point of this curving inward may be difficult to reach when planarizing layer 12.

FIG. 2 shows a cross section that clearly demonstrates the result of the planarization process. Especially noteworthy in this cross section is the area 18 where, due to CMP dishing, the surface of layer 12 (FIG. 1) curves inward resulting in a not planar layer in area 18 (FIG. 2). The "dishing" of the surface in the region 18 represents poor planarization and is, from a semiconductor manufacturing point of view, highly undesirable.

Current planarization practice is highlighted in FIGS. 3 and 4. FIG. 3 shows a cross section where a pattern 22 of photo resist or polysilicon is deposited, this pattern serves as a mask that buffers the etching of layer 16 that is covered by pattern 22. Pattern 22 is a reverse mask pattern of the pattern of metal lines 10. The results obtained after etching are shown in the cross section presented in FIG. 4. It is clear from the cross section that surfaces 26 and 28 do not meet the requirement of good planarity due to the resulting protruding spikes 30. Further disadvantages of this reverse mask etching and planarization approach is that the process has acquired added complexity and cost while it also requires the use of a reverse mask.

U.S. Pat. No. 4,665,007 (Cservak et al.) shows a planarization method using a polymer (positive tone imaging) to fill valleys and CMP the polymer and oxide. This patent uses a positive-image polymer in contrast to the invention's negative-image polymer (PPMS). Overall this patent is close to the invention.

U.S. Pat. No. 5,077,234 (Scoopo et al.) shows a planarization method using photoresist layers.

SUMMARY OF THE INVENTION

A principle object of the present invention is to provide a simple method for planarization.

It is another objective of the invention to provide a method of semiconductor surface planarization that does not require the use of reverse masking techniques.

It is another objective of the invention to provide a method of semiconductor surface planarization that does not require steps of etching and stripping.

It is another objective of the invention to provide a method of semiconductor surface planarization that is independent of semiconductor circuit structure density and that therefore eliminates the phenomenon of "dishing" in the planarized surface.

It is another objective of the invention to provide a method of semiconductor surface planarization that provides good planarization control in providing similar Si—O—Si bonding structures for both PPMSO and oxide layer.

In accordance with the objects of this invention, a new method is provided for planarizing silicon dioxide surfaces in semiconductor structures. The process starts by defining the structure of the underlying layer (for instance a layer of metal lines). A layer of oxide is deposited and, by positive tone imaging, etched to define the underlying layer in the profile of the surface of the oxide. A layer of PPMS is deposited over the defined structure layer. Using the mask of the underlying layer, the PPMS layer is exposed in a pattern identical to the pattern of the underlying layer. The unexposed regions of the PPMS layer are removed, the exposed regions of the PPMS (where PPMSO is formed) have a pattern that is the negative image of the pattern of the underlying layer. During CMP, this PPMSO (exposed PPMS) layer is removed down to the top surface of the profile of the surface of the oxide and hence achieves global planarization. If required, the surface thus created can further be planarized to the point where no more PPMSO is present (the PPMSO "columns" are removed together with the intra-layer of patterned oxide). The surface thus created shows excellent planarity, this surface can be further planarized down to the top level of the underlying pattern, if it is desirable to do so.

BRIEF DESCRIPTION OF THE DRAWINGS

FIG. 1 shows a cross section of a Prior Art pattern of metal lines together with a layer deposited over this pattern, before CMP.

FIG. 2 shows a cross section of a Prior Art pattern of metal lines together with a layer deposited over this pattern, after CMP.

FIG. 3 shows a cross section of a Prior Art reverse patterned photo resist overlying a layer deposited over a pattern of metal lines.

FIG. 4 shows a cross section of a Prior Art reverse patterned photo resist (as per FIG. 3) after etching and stripping of the photo resist.

DESCRIPTION OF THE PREFERRED EMBODIMENT.

Figure 5:
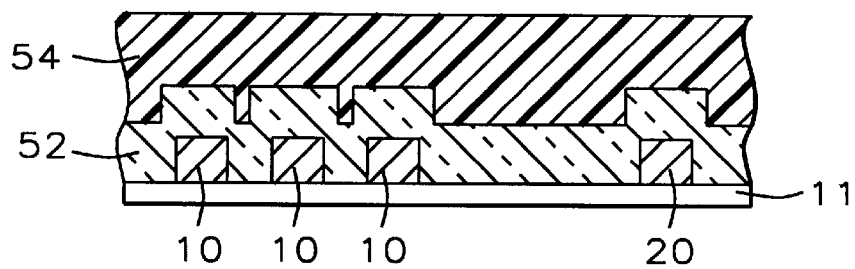
FIG. 5 shows a cross section of the formation of a positive tone image of the pattern of the underlying lines followed by the deposition of a layer of PPMS.

Referring now specifically to FIG. 5, there is shown a cross section of a pattern of an underlying structure 10 and 20, a layer 52 of oxide that has been patterned and etched using the positive tone image of the pattern of the underlying structure, and a layer of Plasma Polymerized Methylsilane (PPMS) after this layer 54 has been CVD deposited and planarized It must be pointed out at this time that pattern 10 and 20 forms a pattern that comprises a low trench density region with pattern 20 and a high trench density region with pattern 10. The layer of PPMS is sensitive to 248 and 193 nm. UV light. Where the above description uses oxide for the layer 52, other materials can also be used for this purpose, for instance Spin-On-Glass (SOG) and Spin-On-Organic polymers or similar low-k dielectric materials. The layer of PPMS is typically deposited to a thickness of between about 5,000 and 10,000 Angstrom. For polymer to be sensitive to 193 nm UV light exposure, the conditions of deposition of layer 54 are the same as the conditions for 248 nm UV light exposure. That is the same material (when using the same method of deposition) can be equally sensitive to exposure of both 193 nm and 248 nm UV light.

The suggested method of depositing layer 54, the layer of PPMS, is using methylsilane as the source being deposited at 13.56 MHz, applying a low powered deposition. The methylsilane is delivered at a flow rate of between about 50 and 200 sccm for the 248 nm. imaging, the deposition rate being 25 to 30 nm./min. Normal deposition requires a deposition of a 100 nm. film.

Figure 6:
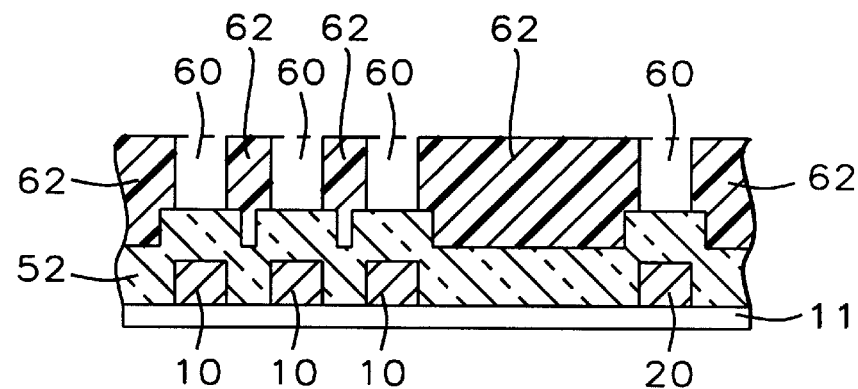
FIG. 6 shows a cross section of the exposure of the layer of PPMS using the pattern of the underlying lines.

FIG. 6 shows a cross section of the exposure of the layer 54 (FIG. 5) of PPMS applying the mask used to create the underlying structure pattern 10 and 20. This exposure results in oxidative cross-linking of the exposed areas within the PPMS as a result of which the exposed PPMS regions are converted to PPMSO. The exposed regions within the PPMS layer that have in this manner been converted to PPMSO are highlighted with 62, the unexposed regions are highlighted with 60. Exposure processing conditions are as follows: an exposure of between about 200 and 400 mJ/cm$^2$ for a time of between about 10 and 100 seconds.

Figure 7:
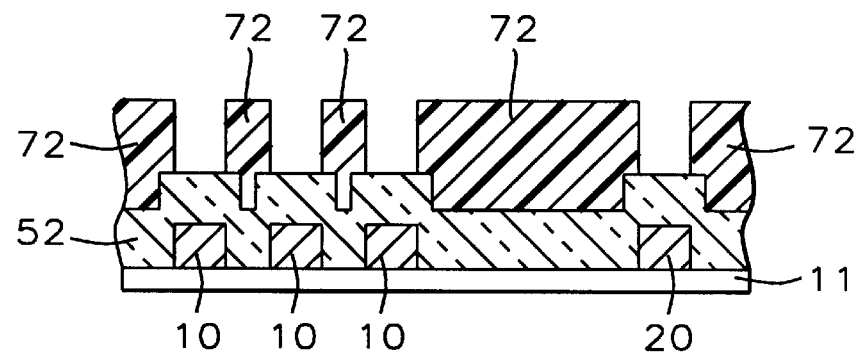
FIG. 7 shows a cross section of the results of etching of the unexposed regions of PPMS.

FIG. 7 shows a cross section after developing the layer of PPMS/PPMSO, using a $Cl_2$ plasma chemistry, which removes the PPMS while leaving in place depositions 72 of PPMSO. The depositions 72 of PPMSO are above and in line with the gaps between the underlying structure 10 and 20. The PPMSO pattern 72 is the negative image of the underlying structure pattern 10 and 20 with the lower sections of the PPMSO pattern filling the openings the positive tone oxide image 52 (FIG. 5) previously formed. The pattern of openings that is created in the layer 54 (FIG. 5) of PPMS aligns with (and is therefore identical to) the high trench density/low density pattern 10/20 that has been provided on a semiconductor surface 11. The latter surface is typically the surface of a semiconductor substrate. FIG. 7 shows that pattern 72 of PPMSO that remains in place after the unexposed PPMS has been removed aligns with and is identical to the pattern of the trenches that separate the interconnect lines of the high density pattern 10 and the low density pattern 20.

The negative tone image development, that is the removal of the unexposed PPMS regions 60, applies the following processing parameters: a high-density plasma etch if necessary. A $Cl_2/HBr/O_2$ plasma, flowing at between about 80 and 200 sccm with the plasma chamber operating at between about 500 and 2500 Watts and an operating pressure of between about 2 and 200 mTorr.

Figure 8:
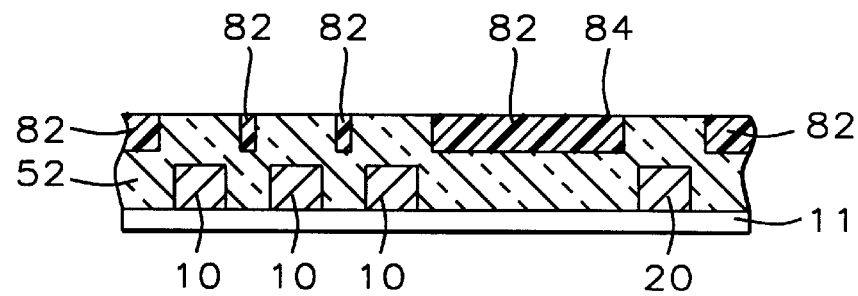
FIG. 8 shows a cross section after planarization of the PPMSO (the exposed region of the PPMS layer).

FIG. 8 shows the results of surface planarization, this planarization has proceeded down to surface 84 where the regions 82 of the PPMSO that are protruding into the positive tone oxide image are partially left intact. A surface hard bake and/or an UV cure can precede this planarization. The surface 84 that is shown in FIG. 8 is essentially 100% planar since the PPMSO is actually a type of silicon oxide by having a similar silicon and oxide bonding. The PPMSO also has a similar CMP removal rate as that of the oxide dielectric. This eliminates problems of planarity of surface 84. For the hard bake, the temperature can be up to 750 degrees C. For the UV cure, the light source will provide a flood exposure at UV wavelength.

Figure 9:
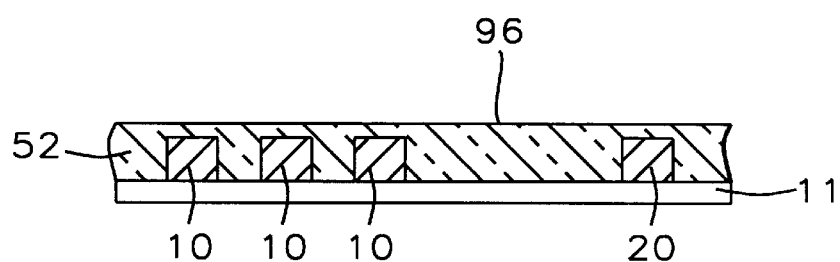
FIG. 9 shows further planarization of the created surface.

FIG. 9 shows the results of further surface planarization, this planarization has proceeded down to surface 96 where no more PPMSO remains. It is clear from this cross section that the process of the invention eliminates any possibility of dishing in the planarized surface. The deposited positive tone layer 52 of oxide (FIG. 1) serves as a "buffer" to the planarization process whereby planarity is determined strictly by the characteristics of the planarization techniques used and whereby the planarity is independent of the pattern of the initial layer of metal lines.

Figure 10:
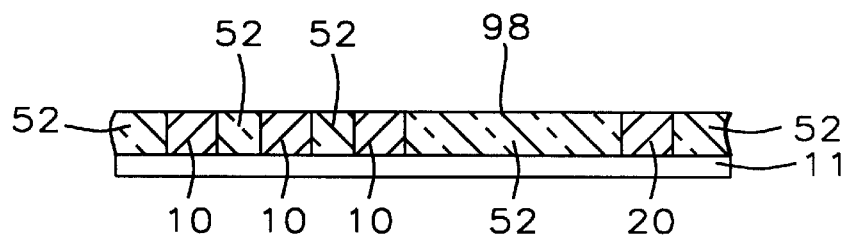
FIG. 10 shows potential further planarization of the created surface.

FIG. 10 shows a cross section whereby the planarization has been continued to surface 98 where no oxide is left on the top surfaces of the original underlying structure. This step of planarization is optional.

Considerations that lead to the continued planarization that has been indicated in going from FIG. 8 to FIG. 9 and to FIG. 10 are dependent on and determined by specific device requirements and process parameters. If for instance the PPMSO that is produced in the above indicated manner has a dielectric constant that is significantly different from the oxide dielectric, then the process up to FIG. 9 is the minimum that is required. There are however certain processes in the fabrication of Integrated Circuits that require a procedure that leads to the cross section as shown in FIG. 10.

It will be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. A method for forming a planarized semiconductor structure comprising:

providing a silicon substrate;

providing a pattern of interconnect lines on the surface of said silicon substrate, said pattern of interconnect lines being separated by trenches;

depositing a layer of dielectric material over said pattern of interconnect lines;

forming a layer of negative-image Plasma Polymerized Methylsilane (PPMS) over said layer of dielectric material;

exposing the surface of said layer of negative-image PPMS in a pattern that is a reverse image of said pattern of interconnect lines that has been provided on the surface of said silicon substrate, creating a pattern of unexposed PPMS that aligns with said pattern of interconnect lines that has been provided on the surface of said substrate, whereby unexposed regions of said negative-image PPMS can be removed by development of said negative-image PPMS, enabling the removal by etching of said layer of PPMS in a pattern that aligns with said pattern that has been provided on the surface of said substrate;

etching said exposed layer of negative-image PPMS, removing said PPMS from above said pattern of interconnect lines that has been provided on the surface of said substrate, creating a pattern of PPMSO that overlays said trenches that separate said interconnect lines; and planarizing said pattern of PPMSO that overlays said trenches that separate said interconnect lines.

2. The method of claim 1 wherein said applying a layer of dielectric material is applying a layer of oxide.

3. The method of claim 1 wherein said forming a layer of negative-image PPMS is creating a Plasma Enhanced CVD (PECVD) layer of Plasma Polymerized Methylsilane (PPMS) on said dielectric.

4. The method of claim 3 wherein said creating a PECVD layer of PPMS is depositing methylsilane at 13.56 MHz using a low radio-frequency powered energy source, whereby said methylsilane is delivered at a flow rate between 50 and 200 sccm with a wave-length of radio-frequency exposure of 248 nm with a rate of deposition between 20 and 35 nm/min.

5. The method of claim 1 wherein said patterning said layer of negative-image PPMS is patterning said layer using a mask of said interconnect lines provided on the surface of said substrate, exposing said layer of negative-image PPMS in a pattern that aligns with said trenches that separate said interconnect lines provided on the surface of said substrate.

6. The method of claim 1 wherein said etching said exposed layer of negative-image PPMS is performed using a high-density plasma etch, further applying a $Cl_2/HBr/O_2$ plasma at a flow rate of between 80 and 200 sccm, operating at a power level of between 500 and 2500 Watts and a plasma chamber operating pressure between 2.0 and 200 mTorr.

7. The method of claim 1 wherein said planarizing said pattern of PPMSO that overlays said trenches that separate said interconnect lines is planarizing the surface of said PPMSO pattern to a level below the surface of said deposited layer of dielectric, whereby not all PPMSO is removed.

8. The method of claim 1 wherein said planarizing said pattern of PPMSO that overlays said trenches that separate said interconnect lines is planarizing the surface of said PPMSO pattern to a level whereby all PPMSO is removed, creating a surface above a plane of the surface of said interconnect lines that have been provided on the surface of said substrate.

9. The method of claim 1 wherein said planarizing said pattern of PPMSO that overlays said trenches that separate said interconnect lines is planarizing the surface of said PPMSO pattern to a level whereby all PPMSO is removed, creating a surface in a plane of the surface of said interconnect lines that have been provided on the surface of said substrate.

10. The method of claim 1 with the additional step of performing a hard bake of the surface of the created pattern of PPMSO and a bottom of trenches created by etching the exposed layer of negative-image PPMS, said hard bake to be performed prior to the step of planarizing said PPMSO pattern.

11. The method of claim 1 with the additional step of performing a UV cure of the surface of the created pattern of PPMSO and a bottom of trenches created by etching the exposed layer of negative-image PPMS, said UV cure to be performed prior to the step of planarizing said PPMSO pattern.

12. The method of claim 1 with the additional step of performing a hard bake and/or a UV cure of the top surface of the created pattern of PPMSO and the bottom of the trenches created by etching the patterned PPMS said hard bake to be performed prior to the step of planarizing said PPMSO pattern.

13. A method for forming a planarized semiconductor structure comprising:

providing a silicon substrate, said silicon substrate having been provided on the surface thereof with a pattern of interconnect lines, said interconnect lines being separated by trenches;

applying a layer of dielectric polymer material to said substrate to fill the trenches that separate said interconnect lines;

forming a thick layer of PPMS over said dielectric polymer layer;

exposing to radiation said layer of PPMS using a mask which is identical to a mask that has been used to define the trenches that separate said interconnect lines, said radiation leaving unexposed said layer of PPMS in a pattern that aligns with the pattern of said interconnect lines, to obtain oxidation of said PPMS, converting said exposed PPMS to PPMSO, creating a pattern of PPMSO that aligns with said pattern of trenches that separate said interconnect lines;

removing said unexposed PPMS, leaving said PPMSO in place in a pattern that aligns with said trenches that separate said interconnect lines, creating openings in said layer of PPMS that align with said pattern of interconnect lines; and planarizing the pattern of remaining PPMSO.

14. The method of claim 13 wherein said applying a layer of dielectric polymer material is applying a layer of oxide.

15. The method of claim 13 wherein said forming a thick layer of PPMS is creating a Plasma Enhanced CVD (PECVD) layer of Plasma Polymerized Methylsilane (PPMS) on said applied layer of dielectric.

16. The method of claim 15 wherein said creating a PECVD layer of PPMS is depositing methylsilane at 13.56 MHz using a low radio-frequency powered energy source, whereby said methylsilane is delivered at a flow rate between 50 and 200 sccm with a wave-length of exposure of 248 nm, with a rate of deposition between 20 and 35 nm/min.

17. The method of claim 13 wherein said removing said unexposed PPMS is performed using a high-density plasma etch, further applying a $Cl_2/HBr/O_2$ plasma at a flow rate of between 20 and 200 sccm, operating at a power level of between 500 and 2500 Watts and a plasma chamber operating pressure between 2.0 and 200 mTorr.

18. The method of claim 13 wherein said planarizing the pattern of remaining PPMSO is planarizing the surface of said PPMSO pattern to a level below the surface of said applied layer of dielectric polymer, whereby not all PPMSO is removed.

19. The method of claim 13 wherein said planarizing the pattern of remaining PPMSO is planarizing the surface of said PPMSO pattern to a level whereby all PPMSO is removed, creating a surface above a plane of the surface of said trenches that separate said interconnect lines.

20. The method of claim 13 wherein said planarizing the pattern of remaining PPMSO is planarizing the surface of said PPMSO pattern to a level whereby all PPMSO is removed, creating a surface in a plane of the surface of said trenches that separate said interconnect lines.

21. The method of claim 13 with the additional step of performing a hard bake of the surface of the created pattern of PPMSO and a bottom of trenches created by etching the patterned PPMS, said hard bake to be performed prior to the step of planarizing said PPMSO pattern.

22. The method of claim 13 with the additional step of performing a hard bake of the surface of the created pattern of PPMSO and a bottom of trenches created by etching the patterned PPMS, said hard bake to be performed prior to the step of planarizing said PPMSO pattern.

23. The method of claim 13 with the additional step of performing a UV cure of the surface of the created pattern of PPMSO and a bottom of trenches created by etching the patterned PPMS, said UV cure to be performed prior to the step of planarizing said PPMSO pattern.

24. The method of claim 13 with the additional step of performing a hard bake and a UV cure of the surface of the created pattern of PPMSO and a bottom of trenches created by etching the patterned PPMS, said hard bake to be performed prior to the step of planarizing said PPMSO pattern.

* * * * *